(12) United States Patent
Nad et al.

(10) Patent No.: US 11,694,898 B2
(45) Date of Patent: Jul. 4, 2023

(54) HYBRID FINE LINE SPACING ARCHITECTURE FOR BUMP PITCH SCALING

(71) Applicant: Intel Corporation, Santa Clara, CA (US)

(72) Inventors: Suddhasattwa Nad, Chandler, AZ (US); Jeremy Ecton, Gilbert, AZ (US); Bai Nie, Chandler, AZ (US); Rahul Manepalli, Chandler, AZ (US); Marcel Wall, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 951 days.

(21) Appl. No.: 16/363,688

(22) Filed: Mar. 25, 2019

(65) Prior Publication Data

US 2020/0312665 A1 Oct. 1, 2020

(51) Int. Cl.
*G09G 3/20* (2006.01)
*H01L 21/28* (2006.01)
*H01L 21/48* (2006.01)
*H01L 23/00* (2006.01)

(52) U.S. Cl.
CPC ...... *H01L 21/2815* (2013.01); *H01L 21/4853* (2013.01); *H01L 24/17* (2013.01); *H01L 2224/17051* (2013.01)

(58) Field of Classification Search
CPC ....... H01L 2224/73265; H01L 23/5386; H01L 2224/48247; H01L 2224/16227; H01L 2224/0401
See application file for complete search history.

(56) References Cited

U.S. PATENT DOCUMENTS

| | | | |
|---|---|---|---|
| 2007/0034404 A1* | 2/2007 | Shin | H01L 23/4985 257/E23.07 |
| 2010/0237500 A1 | 9/2010 | Kwon et al. | |
| 2011/0210433 A1* | 9/2011 | Cho | H01L 24/50 257/676 |

(Continued)

OTHER PUBLICATIONS

European Search Report for European Patent Application No. 20156,771 dated Jul. 24, 2020, 15 pgs.

(Continued)

*Primary Examiner* — Anthony Ho
*Assistant Examiner* — David J Goodwin
(74) *Attorney, Agent, or Firm* — Schwabe, Williamson & Wyatt, P.C.

(57) ABSTRACT

Embodiments disclosed herein include electronic packages and methods of forming such packages. In an embodiment, an electronic package comprises a package substrate, a first die over the package substrate, the first die having a first bump pitch, a second die over the package substrate, the second die having a second bump pitch that is greater than the first bump pitch, and a plurality of conductive traces over the package substrate, the plurality of conductive traces electrically coupling the first die to the second die. In an embodiment, a first end region of the plurality of conductive traces proximate to the first die has a first line space (L/S) dimension, and a second end region of the plurality of conductive traces proximate to the second die has a second L/S dimension. In an embodiment, the second L/S dimension is greater than the first L/S dimension.

19 Claims, 11 Drawing Sheets

(56) References Cited

U.S. PATENT DOCUMENTS

2016/0093557 A1* 3/2016 Nishikizawa ..... H01L 23/49562
                                                        257/676
2018/0049324 A1* 2/2018 Koo ................... H01L 25/0655
2019/0057937 A1  2/2019 Starkston et al.
2021/0333845 A1* 10/2021 Zhou ...................... G06F 1/189
2022/0019103 A1* 1/2022 Lu ...................... G02F 1/13454

OTHER PUBLICATIONS

Extended European Search Report for European Patent Application No. 20156771 dated Oct. 26, 2020, 13 pgs.

* cited by examiner

US 11,694,898 B2

HYBRID FINE LINE SPACING ARCHITECTURE FOR BUMP PITCH SCALING

TECHNICAL FIELD

Embodiments of the present disclosure relate to electronic packaging, and more particularly, to electronic packages with hybrid fine line space (FLS) architectures and methods of forming such electronic packages.

BACKGROUND

Substrates for next generation chip-to-chip interconnect technologies require significantly higher speed and higher density input/output (I/O) routing. Accordingly, next generation packaging solutions are trending towards higher I/O densities to meet the rapidly increasing demand for greater connectivity and faster speeds. This drives the electronic packaging roadmap to deliver an ever decreasing fine line spacing (FLS) requirements with progressively finer trace widths and pitches. Such architectures, like high density interconnect packaging (HDP), and embedded multi-die interconnect bridge (EMIB) use a combination of decreasing fine line spacing (FLS) and multi-chip assemblies unified on a package.

EMIB technology requires the first level interconnect (FLI) bumps to be scaled down to progressively tighter pitches to deliver direct chip connections to next generation silicon IC dies. However, the adoption of alternate FLS technologies has been slow due to the need to invest in high resolution (HR) lithography toolsets, HR materials, and new photoresists capable of delivering high yielding processes.

EMBODIMENTS OF THE PRESENT DISCLOSURE

Figure 1A:
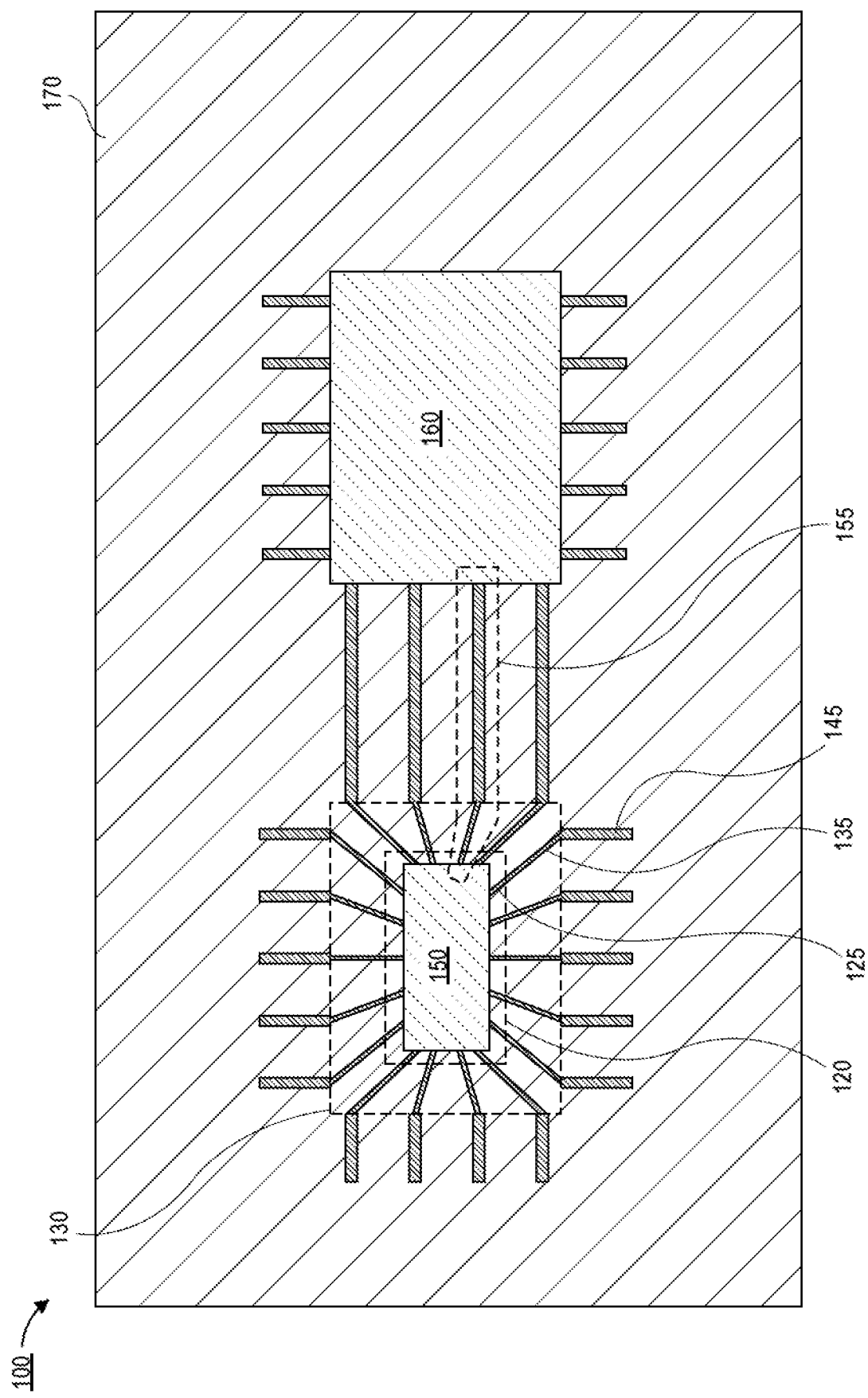
FIG. 1A is a plan view illustration of an electronic package with a hybrid FLS architecture, in accordance with an embodiment.

Described herein are electronic packages with hybrid fine line space (FLS) architectures and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the drive towards next generation chip-to-chip interconnect technologies require significantly higher speed and higher density input/output (I/O) routing. Particularly, technology is driving interconnects to have line/spacing (L/S) dimensions that are progressively finer in trace widths and pitches. However, currently available lithography toolsets and materials (e.g., resists) are not able to resolve such small L/S dimensions. Accordingly, it has been proposed that the industry begin adopting expensive high resolution (HR) lithography toolsets, HR materials, and liquid photoresists capable of delivering high yielding processes. However, such a transition will require a significant capital investment and increase the fabrication costs.

As such, embodiments disclosed herein propose the use of a hybrid FLS architecture that minimizes the cost associated with providing the L/S dimensions needed for advanced technology nodes. Instead of patterning an entire layer of a package with technology suitable for the smallest L/S dimension, embodiments disclosed herein include a first patterning process that uses existing lithography toolsets and materials, and a second patterning process that is localized to areas where a smaller L/S dimension is necessary. In an embodiment, the second patterning process may be implemented with a laser ablation process instead of a lithography process. Lasers suitable for such patterning are already available in most fabrication facilities, and therefore require limited (or none) additional capital investment. Furthermore, since the use of the second patterning process is utilized in discrete regions of the package substrate, the slower laser ablation process does not significantly increase the costs or decrease throughput.

Particularly, conductive traces disclosed herein include a first end region, a transition region, and a second end region. The first end region includes a first L/S dimension that is suitable for connecting to the small bump pitch of advanced technology nodes, and the second end region includes a second L/S dimension that is suitable for larger bump pitches. The transition region provides a bridge between the first L/S dimension to the second L/S dimension. In an embodiment, the first end region and the transition region may be fabricated with a laser ablation process, and the second end region may be fabricated with existing lithography processes.

Embodiments disclosed herein provide several advantages. One advantage is that hybrid FLS architectures disclosed herein allow for bump pitch reduction in order to enable chip attachments and dense packaging for next generation semiconductor chips (e.g., at the 10 nm node, 7 nm node, and more advanced nodes). An additional advantage is that the small L/S dimension enabled by embodiments described herein allows for the connections to semiconductor chips at advanced nodes to be implemented in a single layer. Accordingly, layer count is reduced and provides improved form factors and reduced costs. An additional advantage is that further capital investments are reduced or eliminated since existing toolsets are used.

Embodiments also allow for compatibility with any suitable seed layer deposition (e.g., electroless and sputter) process. Furthermore, since the small L/S dimension is fabricated with a laser ablation process, the impact of flash etch chemistry related trace lifting (which is a major reliability consideration at finer L/S dimensions) is avoided. Additionally, the gradual transition from the first L/S dimension to the second L/S dimension in the transition region enables a high copper density in the small ablated seed region. Thus, concerns with regard to seed continuity in the fine L/S region are minimized or eliminated.

Figure 1B:
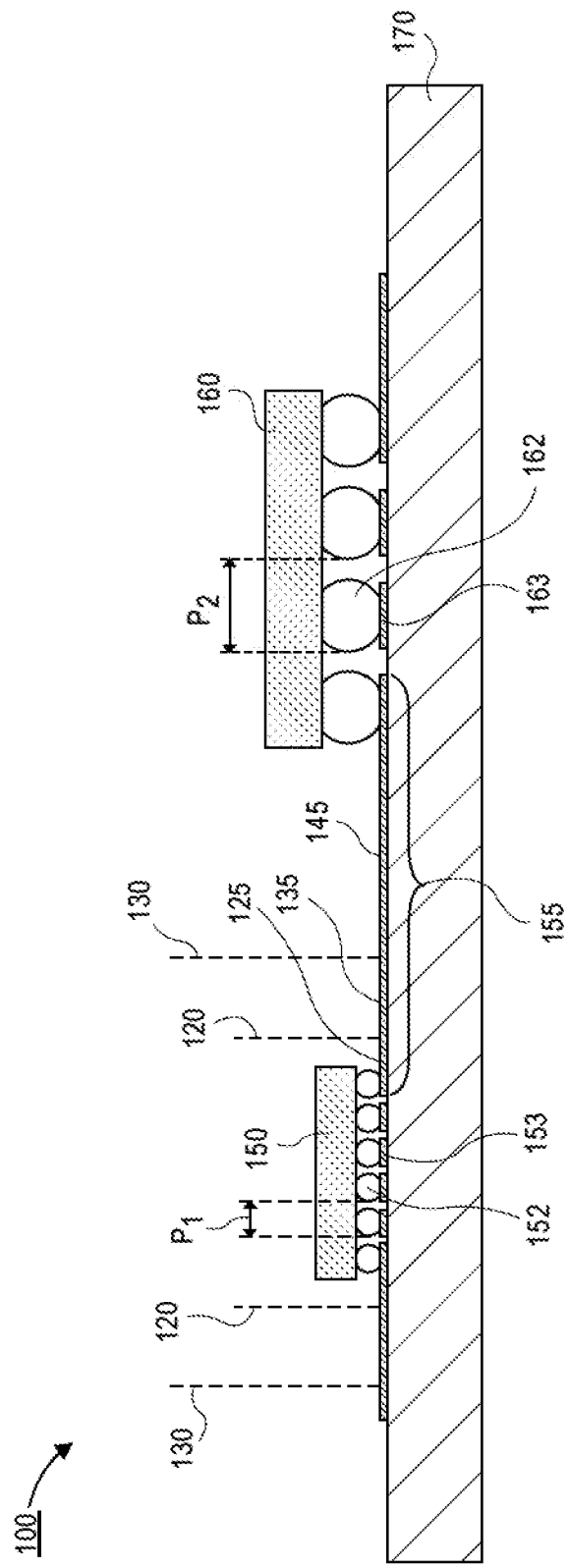
FIG. 1B is a cross-sectional illustration of an electronic package with a hybrid FLS architecture, in accordance with an embodiment.

Referring now to FIGS. 1A and 1B, a plan view illustration and a cross-sectional illustration of an electronic package 100 with a hybrid FLS architecture are shown, respectively, in accordance with an embodiment. In an embodiment, the package 100 may comprise a package substrate 170. The package substrate 170 may comprise one or more dielectric layers (e.g., build-up layers) having conductive traces, vias, pads (not shown) embedded therein. In an embodiment, the package substrate 170 may be a cored package substrate 170 or a coreless package substrate.

In an embodiment, a plurality of dies may be attached to a top surface of the package substrate 170. In a particular embodiment, the plurality of dies may comprise a first die 150 and a second die 160. In an embodiment, the first die 150 may be a semiconductor die that is fabricated at an advanced process node (e.g., 10 nm, 7 nm, or beyond). For example, the first die 150 may be a processor or the like. In an embodiment, the second die 160 may be fabricated at a process node that is less advanced than the first die 150. The second die 160 may be a transceiver die, a memory die, or any other die needed for the electronic package 100.

In an embodiment, the first die 150 may comprise first bumps 152 that have a first bump pitch P1, and the second die 160 may comprise second bumps 162 that have a second bump pitch P2. In an embodiment, the first bump pitch P1 is smaller than the second bump pitch P2. The first bumps 152 may be over first pads 153 and the second bumps 162 may be over second pads 163.

In an embodiment, the first die 150 may be electrically coupled to the second die 160. For example, a plurality of conductive traces 155 may electrically couple first pads 153 to second pads 163. In an embodiment, the plurality of conductive traces 155 may comprise a first end region 125, a transition region 135, and a second end region 145. In an embodiment, the first end region 125 of the conductive trace 155 may be below a shadow of the first die 150, and the transition region 135 of the conductive trace 155 may be between the first end region 125 of the conductive trace 155 and the second end region 145 of the conductive trace 155.

In an embodiment, the transition region 135 of the conductive trace 155 may be bounded on one side by dashed box 120 (and dashed lines 120 in FIG. 1B) and bounded on the opposite side by dashed box 130 (and dashed lines 130 in FIG. 1B). The first dashed box 120 may have a perimeter that is slightly larger than a perimeter of the first die 150. In other embodiments, a perimeter of the first dashed box 120 may be substantially the same as a perimeter of the first die. In yet another embodiment, a perimeter of the first dashed box 120 may be smaller than a perimeter of the first die 150.

In an embodiment, the first end region 125 of the conductive trace 155 may have a first L/S dimension, and the second end region 145 of the conductive trace 155 may have a second L/S dimension. The transition region 135 of the conductive trace 155 may provide a bridge between the first L/S dimension and the second L/S dimension. That is, an edge of the transition region 135 of the conductive trace 155 coupled to the first end region 125 of the conductive trace 155 (i.e., at the dashed box 120) may have the first L/S dimension, and an edge of the transition region 135 of the conductive trace 155 coupled to the second end region 145 of the conductive trace 155 (i.e., at the dashed box 130) may have the second L/S dimension. It is to be appreciated that the dashed boxes/lines 120 and 130 are for illustrative purposes, and that there may not be any distinguishing demarcation along the conductive trace 155 that defines the different regions (i.e., the first end region 125, the transition region 135, and the second end region 145) other than the transition between L/S dimensions. In other embodiments, a demarcation between the transition region 135 and the second end region 145 may be distinguishable by a change in the sidewall profile of the respective regions. As will be described in greater detail below, a sidewall profile of the first end region 125 and the transition region 135 may be different than a sidewall profile of the second end region 145.

As will be described in greater detail below, the second end region 145 of the conductive traces 155 may be fabricated using existing lithography toolsets, materials, and processes, and the first end region 125 and the transition region 135 of the conductive traces 155 may be fabricated with a laser ablation process.

Figure 2A:
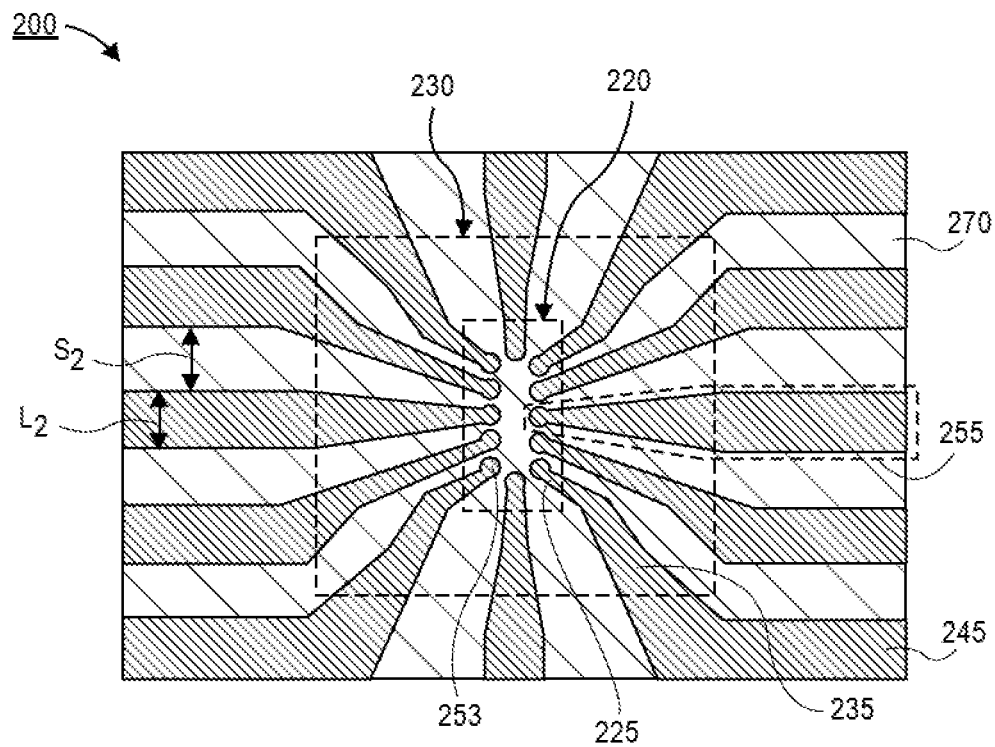
FIG. 2A is a plan view illustration of a plurality of conductive traces with a first end region, a transition region, and a second end region, in accordance with an embodiment.
Figure 2B:
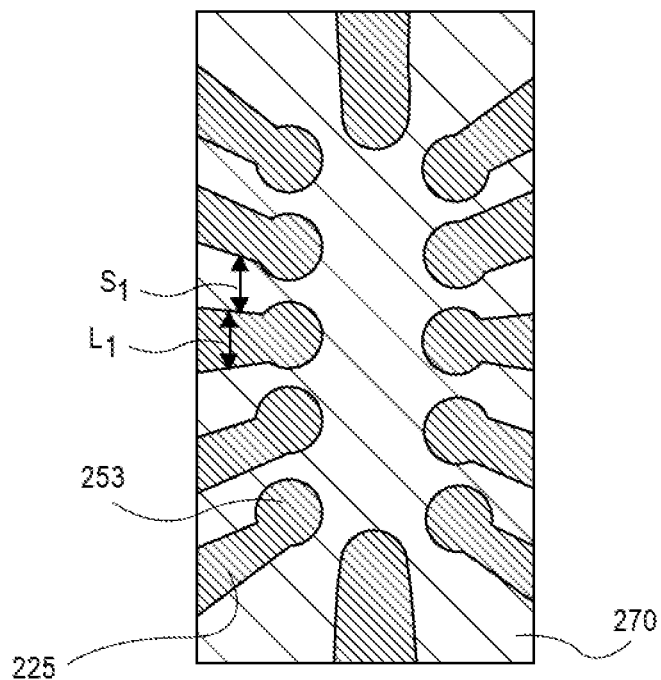
FIG. 2B is a zoomed in plan view illustration of the first end region in FIG. 2A, in accordance with an embodiment.

Referring now to FIG. 2A and FIG. 2B, plan view illustrations of an electronic package 200 that more clearly illustrates the first end regions 225 and the transition regions 235 of conductive traces 255 are shown, in accordance with an embodiment. In an embodiment, the first end region 225 of the conductive traces 255 may be positioned within dashed box 220. The first end region 225 of the conductive traces 255 may be coupled to first pads 253. The first pads 253 may be contacted by first bumps of the first die (not shown in FIGS. 2A and 2B). As shown in FIG. 2B, the pads 253 and the first end regions 225 of the conductive traces 255 may have a first L/S dimension (i.e., $L_1/S_1$). In an embodiment, the first L/S dimension may be less than 9 μm/12 μm, or 2 μm/2 μm or smaller. In an embodiment, second end regions 245 of the conductive traces 255 may have a second L/S dimension (i.e., $L_2/S_2$). In an embodiment, the second L/S dimension may be 9 μm/12 μm or greater.

In an embodiment, the transition region 235 of the conductive traces 255 may extend out from the first end region 225 of the conductive traces 255 towards the second end region 245 of the conductive traces 255. That is, the transition region 235 of the conductive traces 255 may extend from the first dashed box 220 to the second dashed box 230. In an embodiment, the transition region 235 of the conductive traces 255 may provide a bridge from the first L/S dimension $L_1/S_1$ to the second L/S dimension $L_2/S_2$. Accordingly, a L/S dimension of the transition region 235 may increase along its length from the first dashed box 220 to the second dashed box 230.

In an embodiment, the conductive traces 255 may be formed entirely over the surface of the package substrate 270. That is, there is no need to re-route traces 255 to lower levels of the package substrate 270 to accommodate the bump pitch of the first pads 253.

Figure 3A:
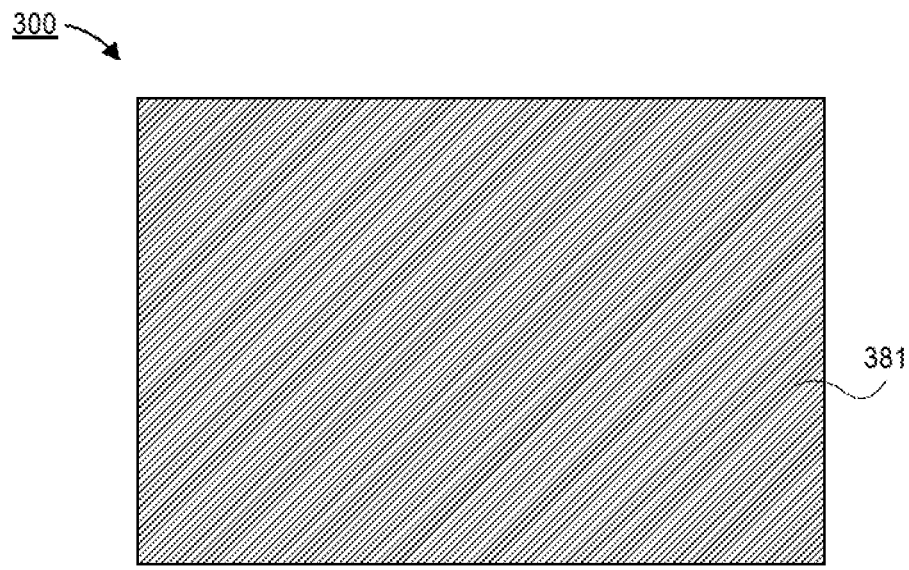
FIG. 3A is a plan view illustration of a seed layer over a package substrate, in accordance with an embodiment.
Figure 3B:
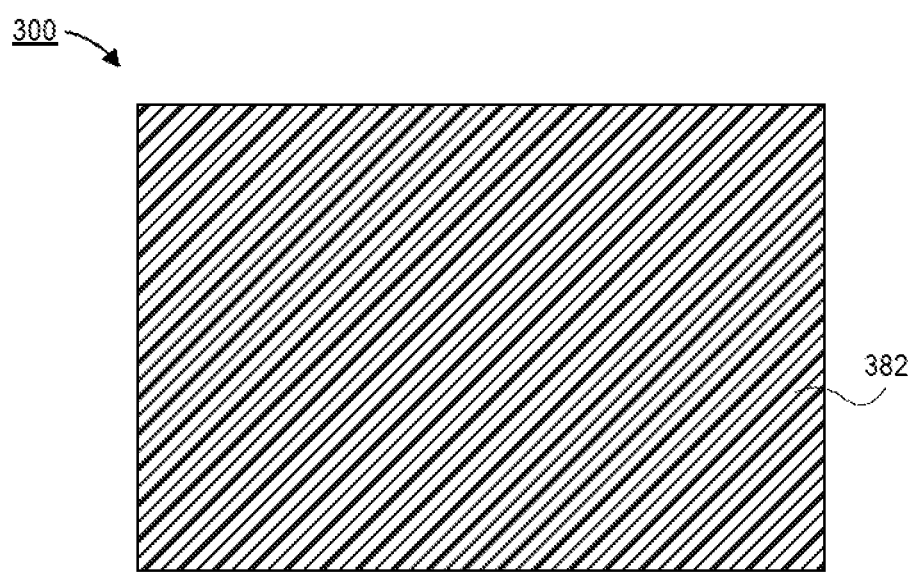
FIG. 3B is a plan view illustration after a resist layer is disposed over the seed layer, in accordance with an embodiment.
Figure 3C:
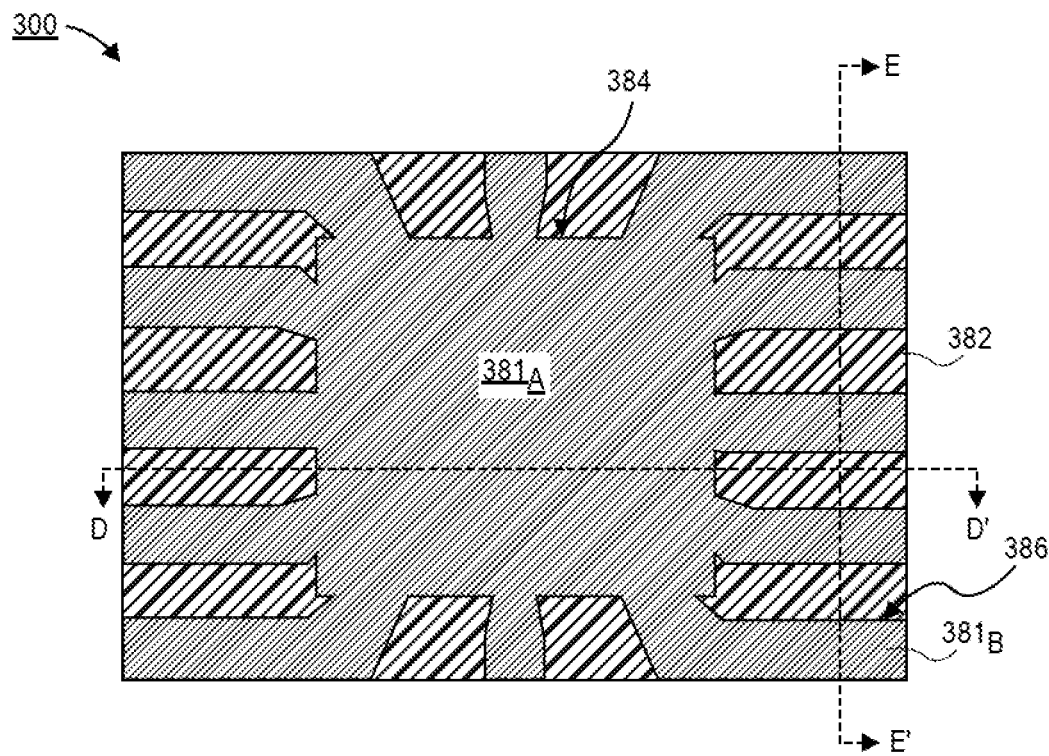
FIG. 3C is a plan view illustration after the resist layer is patterned to form a first opening and a plurality of second openings, in accordance with an embodiment.
Figure 3D:
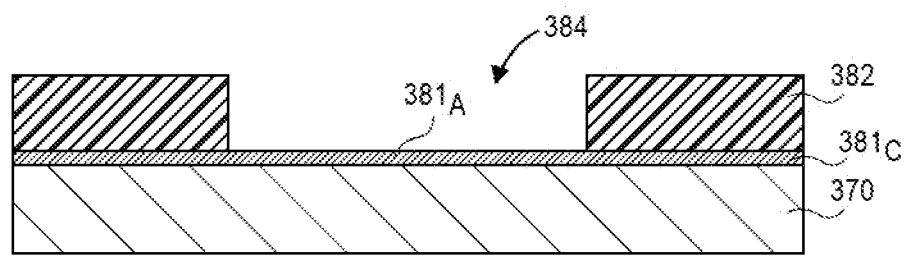
FIG. 3D is a cross-sectional illustration of FIG. 3C along line D-D', in accordance with an embodiment.
Figure 3E:
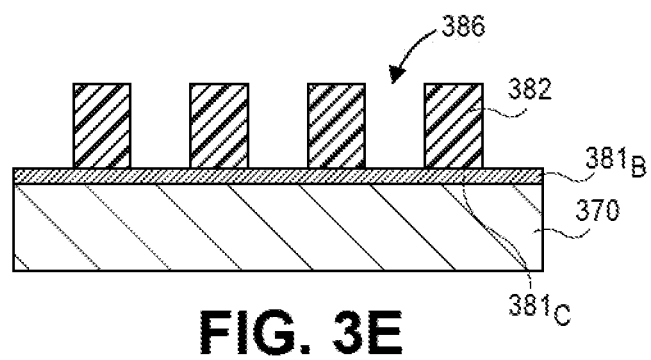
FIG. 3E is a cross-sectional illustration of FIG. 3C along line E-E', in accordance with an embodiment.
Figure 3F:
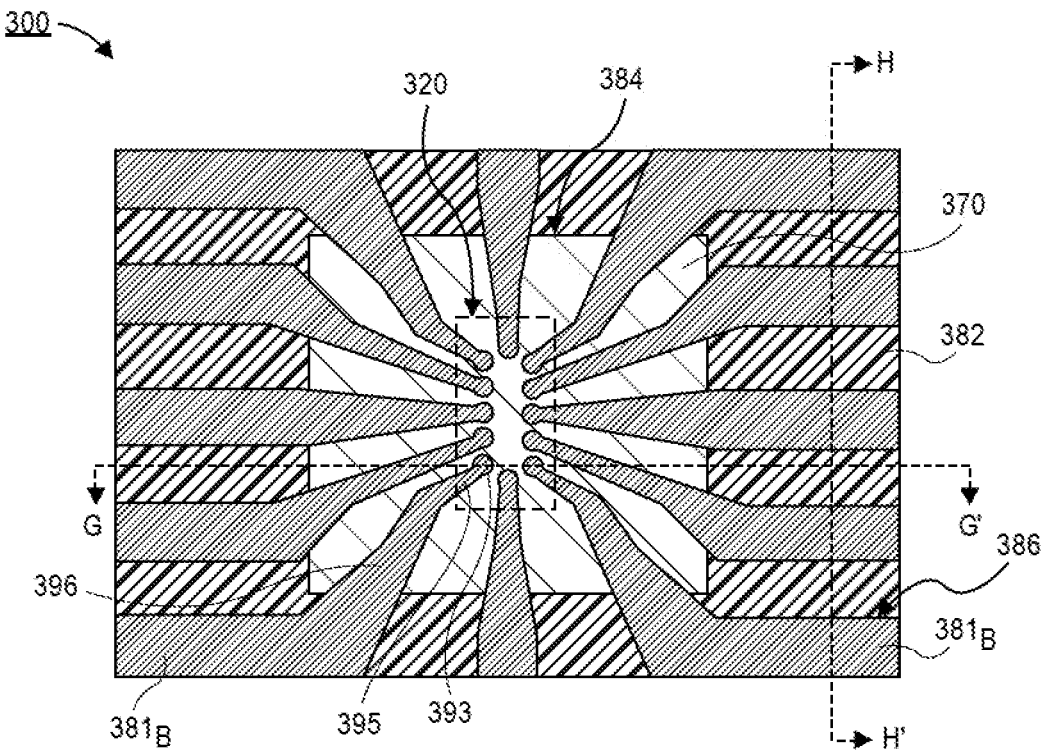
FIG. 3F is a plan view illustration after the seed layer exposed by the first opening is patterned with a laser ablation process, in accordance with an embodiment.
Figure 3G:
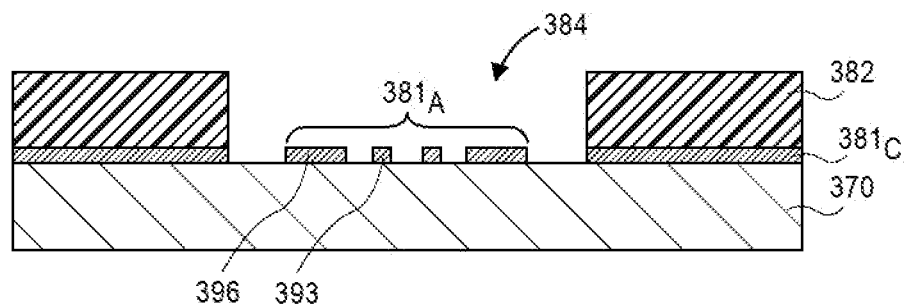
FIG. 3G is a cross-sectional illustration of FIG. 3F along line G-G', in accordance with an embodiment.
Figure 3H:
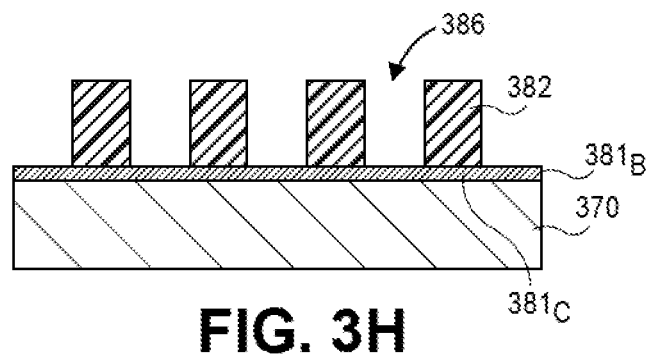
FIG. 3H is a cross-sectional illustration of FIG. 3F along line H-H', in accordance with an embodiment.
Figure 3I:
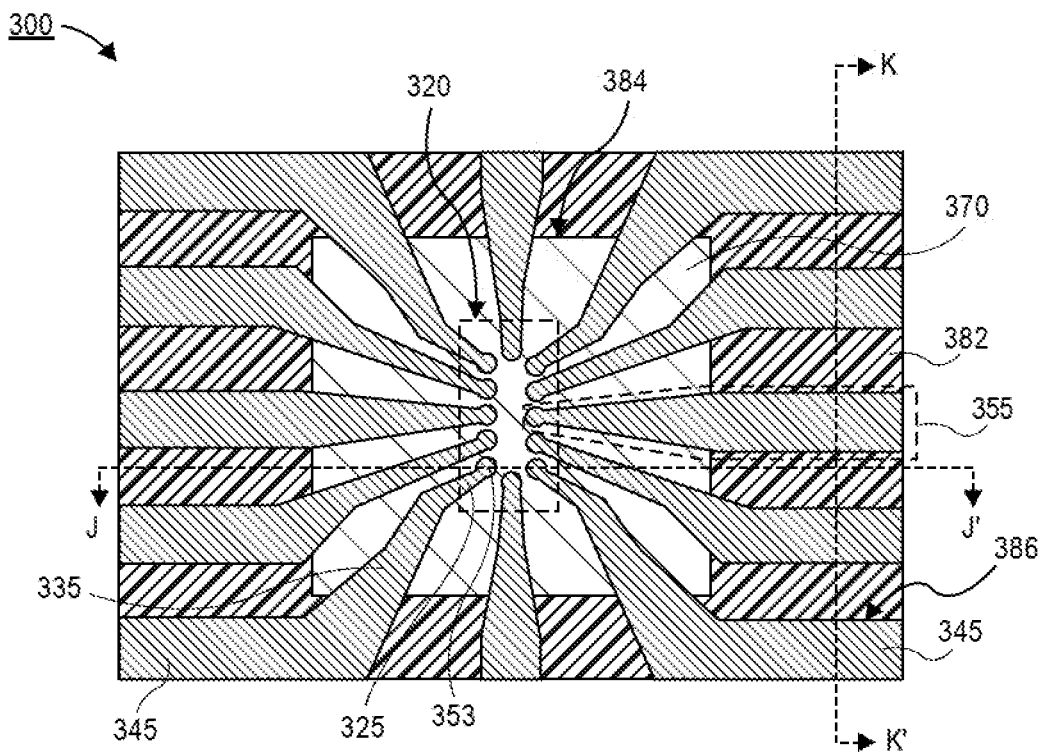
FIG. 3I is a plan view illustration after exposed portions of the seed layer are plated to form a plurality of conductive traces, in accordance with an embodiment.
Figure 3J:
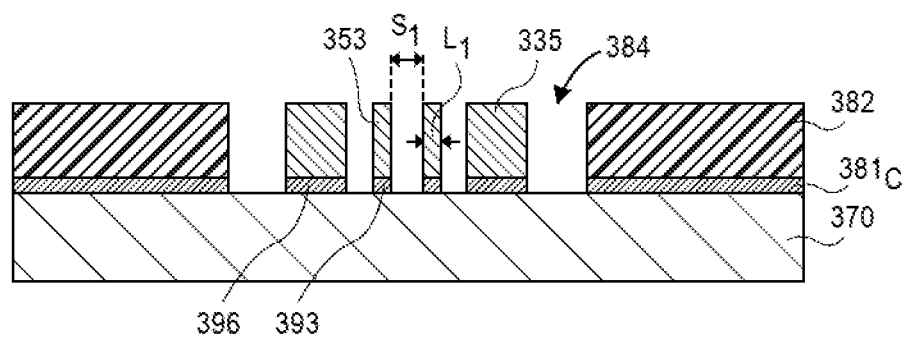
FIG. 3J is a cross-sectional illustration of FIG. 3I along line J-J', in accordance with an embodiment.
Figure 3K:
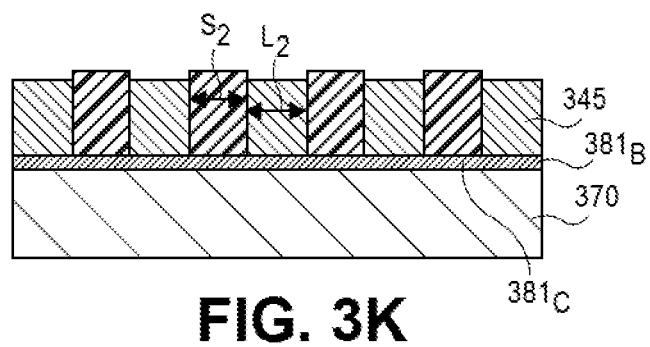
FIG. 3K is a cross-sectional illustration of FIG. 3I along line K-K', in accordance with an embodiment.
Figure 3L:
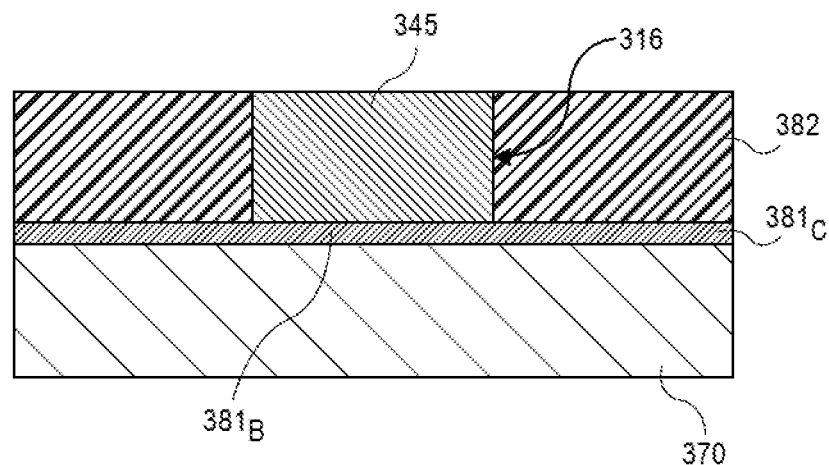
FIG. 3L is a cross-sectional illustration of a second end region of a conductive trace illustrating the sidewall profile, in accordance with an embodiment.
Figure 3M:
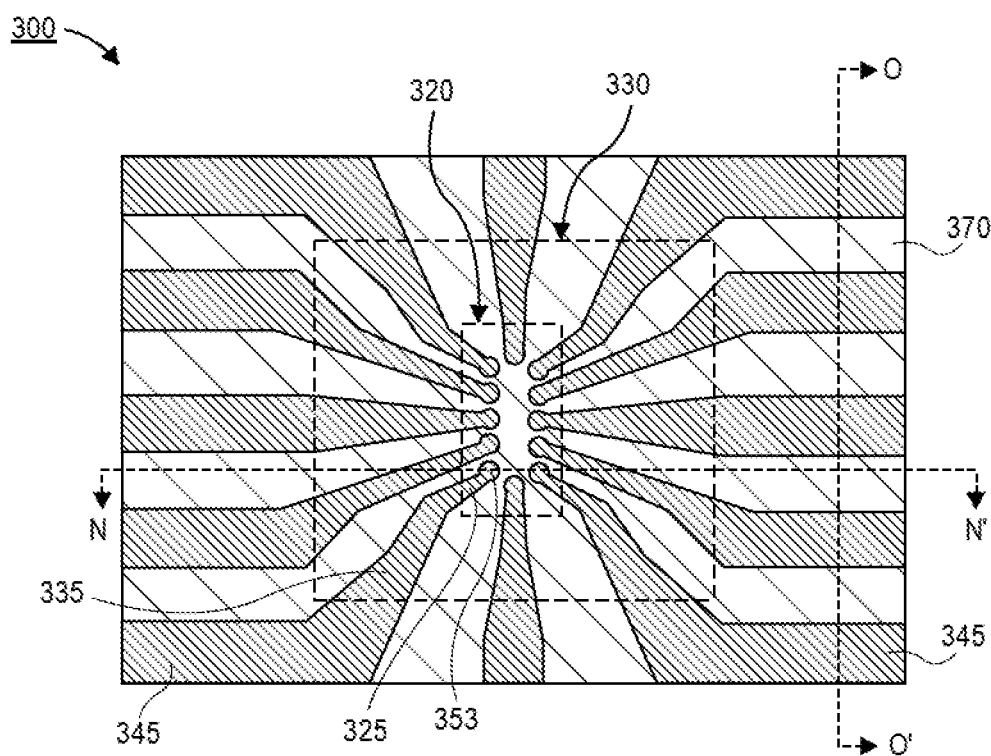
FIG. 3M is a plan view illustration after the resist layer is stripped and exposed portions of the seed layer are removed, in accordance with an embodiment.
Figure 3N:
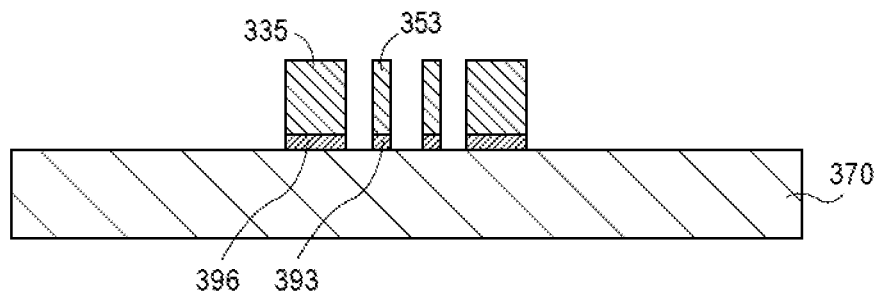
FIG. 3N is a cross-sectional illustration of FIG. 3M along line O-O', in accordance with an embodiment.
Figure 3O:
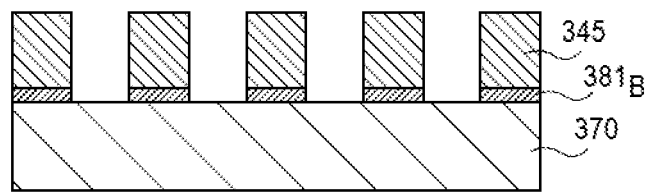
FIG. 3O is a cross-sectional illustration of FIG. 3M along line P-P', in accordance with an embodiment.

Referring now to FIGS. 3A-3O, a series of illustrations depicting a process to form an electronic package with a hybrid FLS architecture is shown, in accordance with an embodiment.

Referring now to FIG. 3A, a plan view illustration of an electronic package 300 after a seed layer 381 is blanket deposited is shown, in accordance with an embodiment. In an embodiment, the seed layer 381 may be deposited with an electroless process, a sputtering process, or any other suitable process. In an embodiment, the seed layer 381 is blanket deposited over an entire surface of the package substrate (not visible in FIG. 3A).

Referring now to FIG. 3B, a plan view illustration of the electronic package 300 after a resist layer 382 is disposed over the seed layer 381 is shown, in accordance with an embodiment. In an embodiment, the resist layer 382 may be any suitable resist material. For example, the resist layer 382 may be a dry film resist (DFR) or the like. In an embodiment, the resist layer 382 may be blanket deposited over the seed layer 381.

Referring now to FIGS. 3C-3E, a plan view illustration and cross-sectional illustrations along line D-D' and line E-E' after the resist layer 382 is patterned are shown, in accordance with an embodiment. In an embodiment, the resist layer 382 may be patterned with a lithographic process. For example, the lithographic process may include existing toolsets and materials (e.g., suitable for forming L/S dimensions of 9 μm/12 μm or greater).

In an embodiment, the resist layer 382 may comprise a first opening 384 and a plurality of second openings 386. The first opening 384 may expose a first portion of the seed layer 381A. The first portion of the seed layer 381A may be located where the first end region of the conductive traces and the transition region of the conductive traces will be formed in subsequent processing operations. That is, the first opening 384 exposes the first region of the seed layer 381A where features with L/S dimensions below the resolution limit of the lithography toolsets and materials used to form the first opening 384 and the second openings 386 are to be located.

In an embodiment, the plurality of second openings 386 may expose second portions of the seed layer 381B. The second portions of the seed layer 381B may be located where the second end portion of the conductive traces will be formed in subsequent processing operations. In an embodiment, the second openings 386 may intersect with the first opening 384. In an embodiment, the remaining portions of the resist layer 382 may cover third portions of the seed layer 381C.

Referring now to FIGS. 3F-3H, a plan view illustration and cross-sectional illustrations along line G-G' and line H-H' after the first portion of the seed layer 381A is patterned are shown, in accordance with an embodiment. In an embodiment, the first portion of the seed layer 381A may be patterned to define pads 393, a first end region 395, and a transition region 396. In an embodiment, the first portion of the seed layer 381A may be patterned with a laser ablation process. The laser ablation may remove areas of the first portion of the seed layer 381A and expose surfaces of the package substrate 370.

In an embodiment, the first end region 395 may have a first L/S dimension and the second portion of the seed layer 381B may have a second L/S dimension. The transition region 396 may provide a bridge from the first L/S dimension to the second L/S dimension. In the illustrated embodiment, the dashed box 320 defines the boundary between the first end region 395 and the transition region 396. However, it is to be appreciated that the boundary defined by box 320 may be located at any point between the pads 393 and the boundary of the opening 384. That is, in some embodiments, the transition region 396 may be directly attached to the pads 393 and extend from the pads 393 to the edge of the first opening 384 (where the transition region 396 connects to the second portion of the seed layer 381B).

Referring now to FIG. 3I-3K, a plan view illustration and cross-sectional illustrations along line J-J' and line K-K' after the conductive traces 355 are plated are shown, in accordance with an embodiment. In an embodiment, the conductive traces 355 may comprise first pads 353 over pads 393, first end regions 325 of the conductive trace 355 over first end region 325, a transition region 335 of the conductive trace 355 over the transition region 396, and second end regions 345 of the conductive trace 355 over the second portion of the seed layer 381B.

In an embodiment, the conductive traces 355 may be plated with an electroless or an electrolytic plating process. Since the seed layer is patterned (e.g., with laser ablation within opening 384, and second openings 386 that are defined by the resist layer 382) the plating will be selectively plated over the exposed portions of the seed layer 381. Accordingly, the conductive traces 355 may comprise a first L/S dimension $L_1/S_1$ within the first opening 384 and a second L/S dimension $L_2/S_2$ outside of the first opening 384. As noted above, the second L/S dimension $L_2/S_2$ may be 9 μm/12 μm or greater, and the first L/S dimension $L_1/S_1$ is less than 9 μm/12 μm.

Referring now to FIG. 3L, a cross-sectional illustration of the second end region 345 of the conductive trace 355 is shown, in accordance with an embodiment. As shown, the sidewalls 316 of the second end region 345 may have a substantially vertical profile since the resist layer 382 provides lateral confinement during the plating process. In contrast, a sidewall profile of the first end region 325 may be distinct from a sidewall profile of the second end region 345. For example, the sidewalls of the first end region 325 may have a non-vertical profile. That is, the sidewalls may extend upwards at an angle other than approximately 90 degrees. The non-vertical sidewall profile is obtained since there is no lateral confinement in the first opening 384. Since the transition region 335 is also not confined laterally by a resist layer, sidewalls of the transition region 335 may also have a non-vertical profile that is substantially similar to the profile of sidewalls of the first end region 325.

Referring now to FIGS. 3M-3O, a plan view illustration and cross-sectional illustrations along line N-N' and line O-O' after the resist layer 382 and exposed portions of the seed layer 381C are removed is shown, in accordance with an embodiment. In an embodiment, the resist layer may be stripped with any suitable process. Subsequent to the removal of the resist layer 382, exposed portions of the seed layer (e.g., third portions 381C previously covered by the resist layer 382 outside of box 330) may be removed with a flash etching process.

Figure 4:
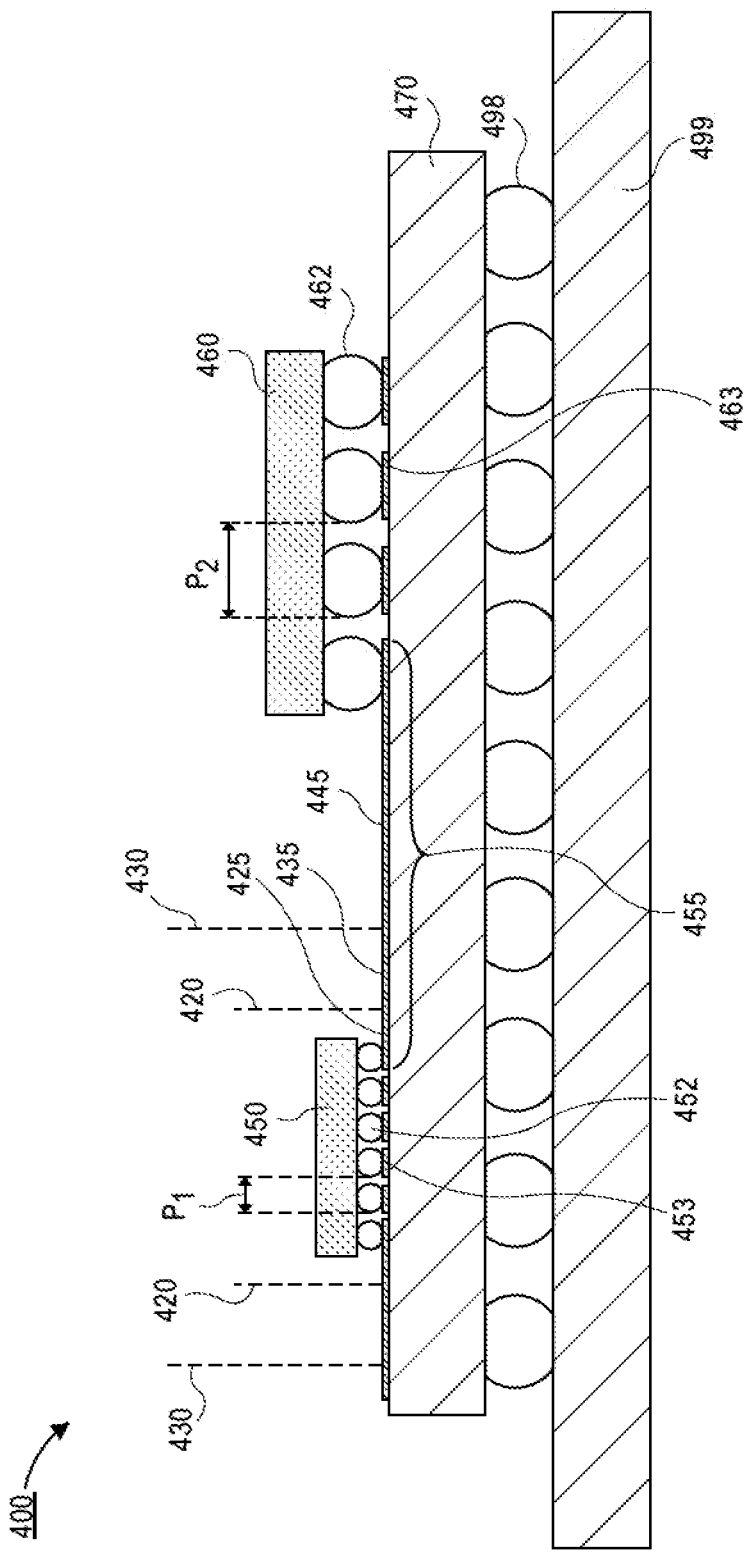
FIG. 4 is a cross-sectional illustration of an electronic system that comprises an electronic package with a hybrid FLS architecture, in accordance with an embodiment.

Referring now to FIG. 4, a cross-sectional illustration of an electronic system 400 is shown, in accordance with an embodiment. In an embodiment, the electronic system 400 may comprise a package substrate 470 that is attached to a board 499. For example, the package substrate 470 may be attached to the board 499 (e.g., a motherboard or the like) with interconnects 498 (e.g., solder bumps, wire bonds, sockets, or the like).

In an embodiment, a first die 450 and a second die 460 may be coupled to the package substrate 470. For example, the first die 450 may have first bumps 452 with a first bump pitch P1 and the second die 460 may have second bumps 462 with a second bump pitch P2 that is larger than the first bump pitch P1. In an embodiment, the first die 450 may be electrically coupled to the second die 460 by a plurality of conductive traces 455. In an embodiment, the conductive traces 455 may electrically couple first bumps 452 below the first die 450 to second bumps 462 below the second die 460 (e.g., with pads 453, traces 455 and pads 463).

In an embodiment, the plurality of conductive traces 455 may comprise a first end region 425, a second end region 445, and a transition region 435 between the first end region 425 and the second end region 445. In an embodiment, the first end region 425 may be located below the first die 450. The transition region 435 of the conductive traces 455 may be between dashed lines 420 and 430. The second end region 445 of the conductive traces 455 may be located outside of the perimeter of the dashed lines 430.

In an embodiment, the first end region 425 of the conductive traces 455 may have a first L/S dimension, and the second end region 445 of the conductive traces 455 may have a second L/S dimension. In an embodiment, the second L/S dimension is larger than the first L/S dimension. For example, the second L/S dimension may be 9 μm/12 μm or greater, and the first L/S dimension may be less than 9 μm/12 μm. In an embodiment, the transition region 435 of the conductive traces 455 may provide a transition from the first L/S dimension to the second L/S dimension. For example, the edge of the transition region 435 at dashed line 420 may have the first L/S dimension, and the transition region 435 may have an increasing L/S dimension along its length until it reaches the second L/S dimension at the dashed line 430.

In an embodiment, the second end region 445 of the conductive traces may be lithographically patterned, and the first end region 425 and the transition region 435 of the conductive traces 455 may be patterned with a laser ablation process using processes such as those described above.

Figure 5:
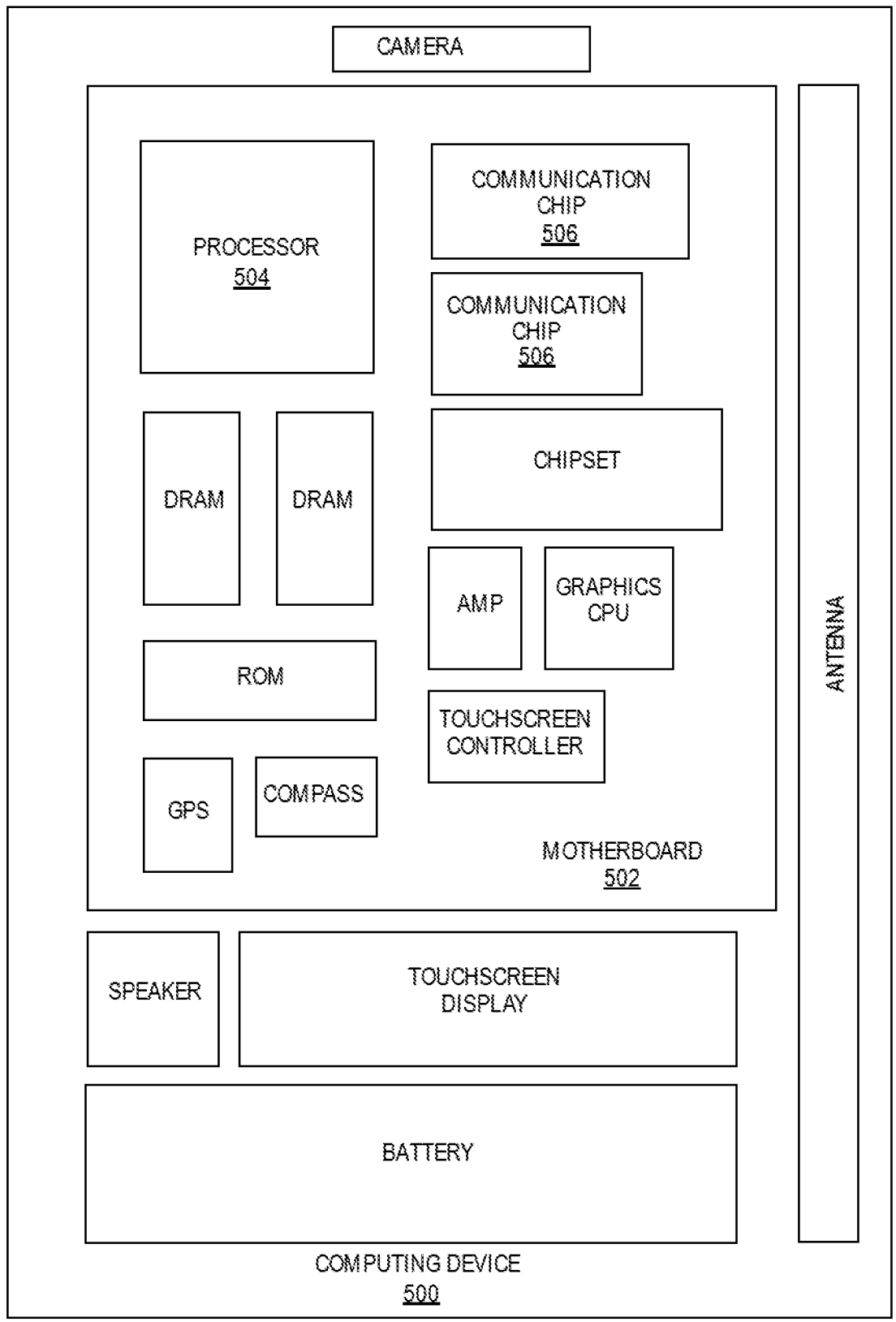
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be packaged in an electronic system that comprises a package substrate with a hybrid FLS architecture, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be packaged in an electronic system that comprises a package substrate with a hybrid FLS architecture, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a first die over the package substrate, the first die having a first bump pitch; a second die over the package substrate, the second die having a second bump pitch that is greater than the first bump pitch; and a plurality of conductive traces over the package substrate, the plurality of conductive traces electrically coupling the first die to the second die, wherein a first end region of the plurality of conductive traces proximate to the first die has a first line space (L/S) dimension, and wherein a second end region of the plurality of conductive traces proximate to the second die has a second L/S dimension, wherein the second L/S dimension is greater than the first L/S dimension.

Example 2: the electronic package of Example 1, wherein the first L/S dimension is less than 9 µm/12 µm, and wherein the second L/S dimension is 9 µm/12 µm or greater.

Example 3: the electronic package of Example 1 or Example 2, wherein the first L/S dimension is 2 µm/2 µm or less.

Example 4: the electronic package of Examples 1-3, wherein the plurality of conductive traces further comprise a transition region between the first end region and the second end region, wherein a first edge of the transition region has the first L/S dimension, and wherein a second edge of the transition region has the second L/S dimension.

Example 5: the electronic package of Examples 1-4, wherein the first end region of the plurality of conductive traces is below the first die.

Example 6: the electronic package of Examples 1-5, wherein the transition region of the plurality of conductive traces is adjacent to the first die.

Example 7: the electronic package of Examples 1-6, wherein the transition region of the plurality of conductive traces surrounds the first die.

Example 8: the electronic package of Examples 1-7, wherein the first die is a processor.

Example 9: the electronic package of Examples 1-8, wherein a generation of the processor is at the 10 nm node, or beyond.

Example 10: the electronic package of Examples 1-9, where a sidewall profile of the first end region is different than a sidewall profile of the second end region.

Example 11: an electronic package, comprising: a package substrate; a first array of pads on the package substrate; a plurality of conductive traces, each coupled to different pads of the pads in the first array of pads, wherein the plurality of conductive traces comprise: a first end region, wherein the first end region has a first line/space (L/S) dimension; a second end region, wherein the second end region has a second L/S dimension; and a transition region between the first end region and the second end region, wherein a first end of the transition region has the first L/S dimension, and wherein a second end of the transition region has the second L/S dimension.

Example 12: the electronic package of Example 11, further comprising: a second array of pads, wherein each conductive trace in the plurality of conductive traces is coupled to different pads of the pads in the second array of pads.

Example 13: the electronic package of Example 11 or Example 12, wherein an entire length of the plurality of conductive traces is over the surface of the package substrate.

Example 14: the electronic package of Examples 11-13, wherein the first L/S dimension is less than 9 µm/12 µm, and wherein the second L/S dimension is 9 µm/12 µm or greater.

Example 15: the electronic package of Examples 11-14, wherein the first L/S dimension is 2 µm/2 µm or less.

Example 16: the electronic package of Examples 11-15, wherein the transition region of the plurality of conductive traces surrounds the first array of pads.

Example 17: a method of forming an electronic package, comprising: disposing a seed layer over a surface of a package substrate; disposing a resist over the seed layer; patterning the resist with a lithography process, wherein the patterned resist comprises: a first opening exposing a first portion of the seed layer; and a plurality of second openings intersecting with the first opening, the plurality of second openings exposing a second portion of the seed layer; patterning the first portion of the seed layer exposed by the first opening with a laser ablation process; and disposing conductive traces over the first portion of the seed layer and the second portion of the seed layer.

Example 18: the method of Example 17, wherein the patterned first portion of the seed layer contacts the second portion of the seed layer.

Example 19: the method of Example 17 or Example 18, wherein the conductive traces comprise a first end region, a second end region, and a transition region between the first end region and the second end region.

Example 20: the method of Examples 17-19, wherein the first end region has a first line/space (L/S) dimension, and the second end region has a second L/S dimension that is greater than the first L/S dimension.

Example 21: the method of Examples 17-20, wherein a first end of the transition region has the first L/S dimension, and wherein a second end of the transition region has the second L/S dimension.

Example 22: the method of Examples 17-21, wherein the first end region and the transition region are located within a perimeter of the first opening.

Example 23: the method of Examples 17-22, further comprising: removing the resist; and removing exposed portions of the seed layer.

Example 24: an electronic system, comprising: a board; a package substrate over the board, wherein the package substrate comprises: an array of first pads having a first pitch; an array of second pads having a second pitch that is larger than the first pitch; a plurality of conductive traces electrically coupling first pads to second pads, wherein the plurality of conductive traces comprise a first line/space (L/S) dimension and a second L/S dimension; a first die over the array of first pads; and a second die over the array of second pads.

Example 25: the electronic system of Example 24, wherein the first L/S dimension is less than 9 µm/12 µm, and wherein the second L/S dimension is 9 µm/12 µm or greater.

What is claimed is:
1. An electronic package, comprising:
a package substrate;

a first die over the package substrate, the first die having a first bump pitch;

a second die over the package substrate, the second die having a second bump pitch that is greater than the first bump pitch; and a plurality of conductive traces over the package substrate, the plurality of conductive traces electrically coupling the first die to the second die, wherein a first end region of the plurality of conductive traces proximate to the first die has a first line space (L/S) dimension, the first L/S dimension having a first trace width, and wherein a second end region of the plurality of conductive traces proximate to the second die has a second L/S dimension, the second L/S dimension having a second trace width, wherein the second trace width of the second L/S dimension is greater than the first trace width of the first L/S dimension.

2. The electronic package of claim 1, wherein the first L/S dimension is less than 9 µm/12 µm, and wherein the second L/S dimension is 9 µm/12 µm or greater.

3. The electronic package of claim 2, wherein the first L/S dimension is 2 µm/2 µm or less.

4. The electronic package of claim 1, wherein the plurality of conductive traces further comprise a transition region between the first end region and the second end region, wherein a first edge of the transition region has the first L/S dimension, and wherein a second edge of the transition region has the second L/S dimension.

5. The electronic package of claim 4, wherein the first end region of the plurality of conductive traces is below the first die.

6. The electronic package of claim 5, wherein the transition region of the plurality of conductive traces is adjacent to the first die.

7. The electronic package of claim 6, wherein the transition region of the plurality of conductive traces surrounds the first die.

8. The electronic package of claim 1, wherein the first die is a processor.

9. The electronic package of claim 1, where a sidewall profile of the first end region is different than a sidewall profile of the second end region.

10. An electronic package, comprising:
a package substrate;
a first array of pads on the package substrate;
a plurality of conductive traces, each coupled to different pads of the pads in the first array of pads, wherein the plurality of conductive traces comprise:
a first end region, wherein the first end region has a first line/space (L/S) dimension, the first L/S dimension having a first trace width;
a second end region, wherein the second end region has a second L/S dimension the second L/S dimension having a second trace width, wherein the second trace width of the second L/S dimension is greater than the first trace width of the first L/S dimension; and
a transition region between the first end region and the second end region, wherein a first end of the transition region has the first L/S dimension, and wherein a second end of the transition region has the second L/S dimension.

11. The electronic package of claim 10, further comprising:
a second array of pads, wherein each conductive trace in the plurality of conductive traces is coupled to different pads of the pads in the second array of pads.

12. The electronic package of claim 11, wherein an entire length of the plurality of conductive traces is over the surface of the package substrate.

13. The electronic package of claim 10, wherein the first L/S dimension is less than 9 µm/12 µm, and wherein the second L/S dimension is 9 µm/12 µm or greater.

14. The electronic package of claim 13, wherein the first L/S dimension is 2 µm/2 µm or less.

15. The electronic package of claim 10, wherein the transition region of the plurality of conductive traces surrounds the first array of pads.

16. An electronic system, comprising:
a board;
a package substrate over the board, wherein the package substrate comprises:
an array of first pads having a first pitch;
an array of second pads having a second pitch that is larger than the first pitch;
a plurality of conductive traces electrically coupling first pads to second pads, wherein the plurality of conductive traces comprise a first line/space (L/S) dimension and a second L/S dimension, the first L/S dimension having a first trace width, and the second L/S dimension having a second trace width, wherein the second trace width of the second L/S dimension is greater than the first trace width of the first L/S dimension;
a first die over the array of first pads; and
a second die over the array of second pads.

17. The electronic system of claim 16, wherein the first L/S dimension is less than 9 µm/12 µm, and wherein the second L/S dimension is 9 µm/12 µm or greater.

18. An electronic package, comprising:
a package substrate;
a first die over the package substrate, the first die having a first bump pitch;
a second die over the package substrate, the second die having a second bump pitch that is greater than the first bump pitch; and
a plurality of conductive traces over the package substrate, the plurality of conductive traces electrically coupling the first die to the second die, wherein a first end region of the plurality of conductive traces proximate to the first die has a first line space (L/S) dimension, and wherein a second end region of the plurality of conductive traces proximate to the second die has a second L/S dimension, wherein the second L/S dimension is greater than the first L/S dimension, and wherein the first L/S dimension is less than 9 µm/12 µm, and wherein the second L/S dimension is 9 µm/12 µm or greater.

19. The electronic package of claim 18, wherein the first L/S dimension is 2 µm/2 µm or less.

* * * * *